United States Patent [19]

Fukuhara et al.

[11] Patent Number: 5,618,750
[45] Date of Patent: Apr. 8, 1997

[54] METHOD OF MAKING FUSE WITH NON-CORROSIVE TERMINATION OF CORROSIVE FUSE MATERIAL

[75] Inventors: Hideyuki Fukuhara, Ami-machi; Yoichi Miyai, Ibaraki, both of Japan

[73] Assignee: Texas Instruments Incorporated, Dallas, Tex.

[21] Appl. No.: 421,331

[22] Filed: Apr. 13, 1995

[51] Int. Cl.$^6$ .............. H01L 21/70; H01L 27/00
[52] U.S. Cl. ............... 438/601; 148/DIG. 55; 438/643
[58] Field of Search ............ 437/60, 922; 257/529; 148/DIG. 55

[56] References Cited

U.S. PATENT DOCUMENTS 5,015,604  5/1991  Lim et al. .................. 437/195

FOREIGN PATENT DOCUMENTS 62-16546  4/1987  Japan .................. 437/922
5-109899A  4/1993  Japan .................. 437/922

*Primary Examiner*—John Niebling
*Assistant Examiner*—Richard A. Booth
*Attorney, Agent, or Firm*—Robby Holland; Leo Heiting; Richard Donaldson

[57] ABSTRACT

A fuse for a semiconductor integrated circuit is provided wherein a strip of corrosive material (82), such as aluminum, has one end thereof connected to a conductive strip (84) of a non-corrosive material and the other end thereof connected to a strip (94) of non-corrosive conductive material. The one end of the conductive strip (82) connected to the conductive strip (84) is connected through a contact (88). Similarly, the other end of the strip (82) is connected through a contact (96) to the non-corrosive conductive strip (94). The strips 84 and 94 provide a barrier to corrosion. This occurs whenever a break (104) is formed in the fuse to expose the ends of the fuse (82) at the break to a corrosive atmosphere. Alternatively, the fuse could be connected to corrosive underlying layers with contacts (118) and (124) of non-corrosive material such as a polysilicon or a polyside, or the active region of the substrate itself.

5 Claims, 3 Drawing Sheets

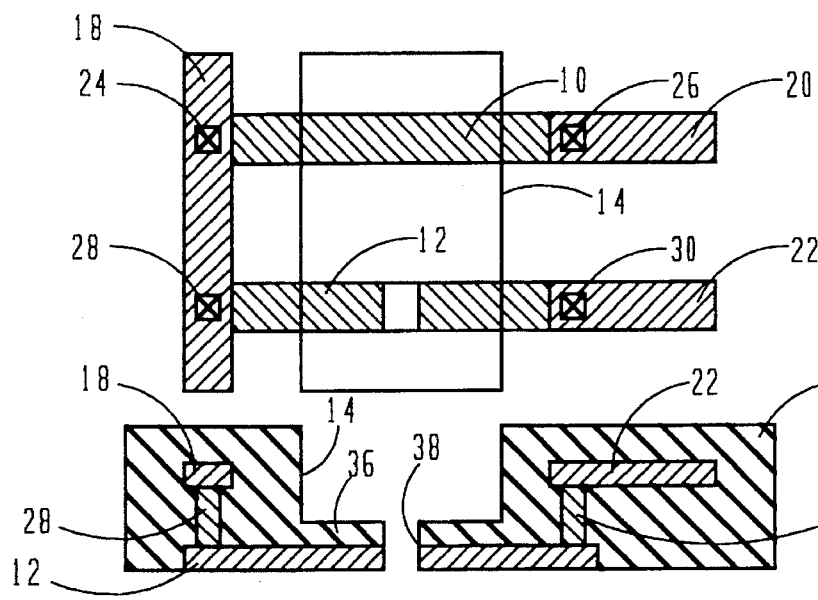
FIG. 1a
(PRIOR ART)
FIG. 1b
(PRIOR ART)
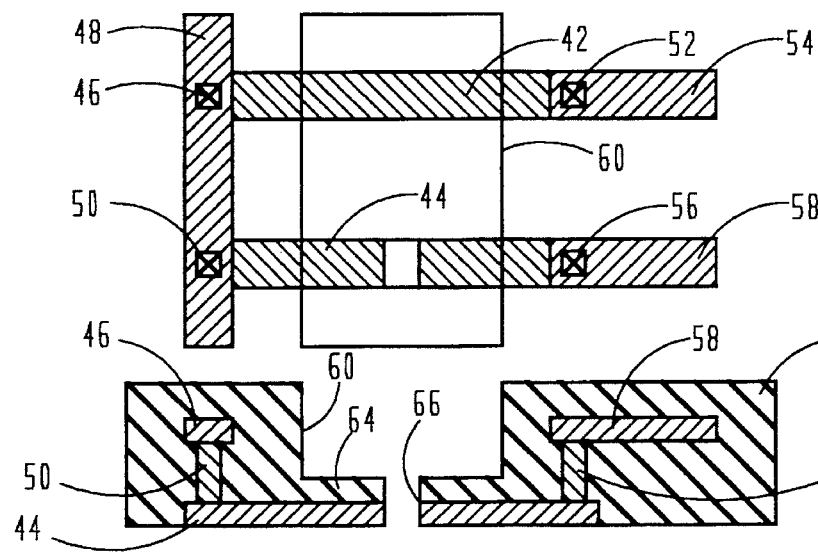
FIG. 2a
(PRIOR ART)
FIG. 2b
(PRIOR ART)
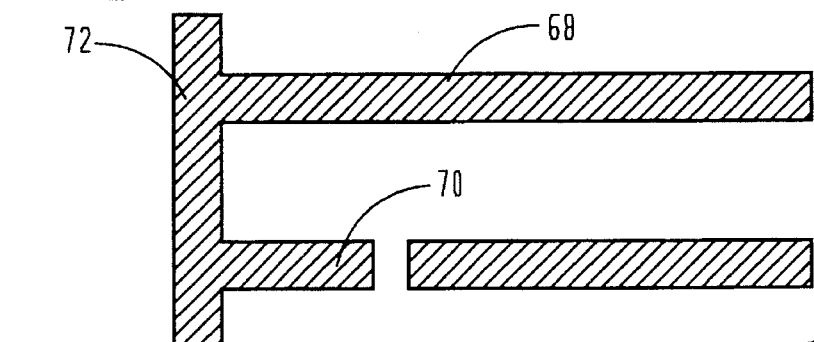
FIG. 3a
(PRIOR ART)
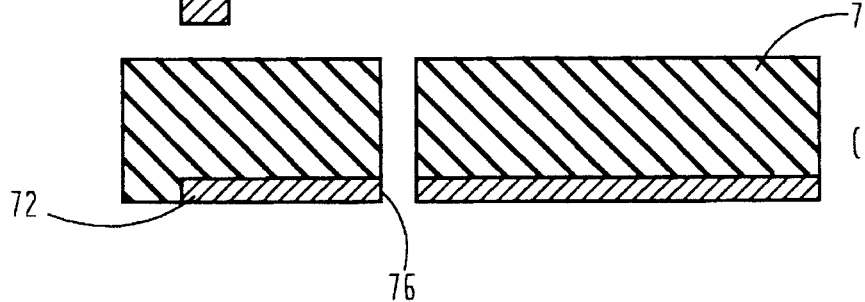
FIG. 3b
(PRIOR ART)

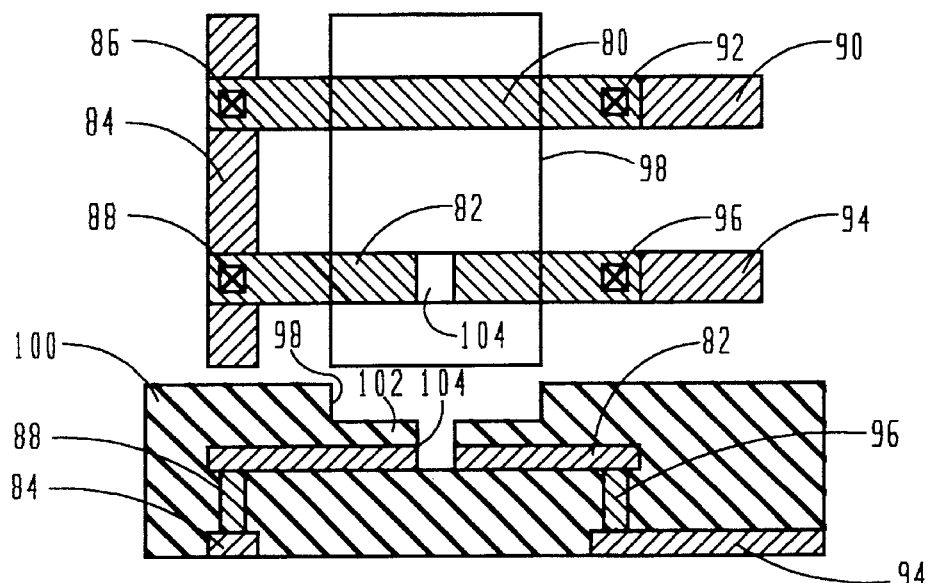
FIG. 4a
FIG. 4b
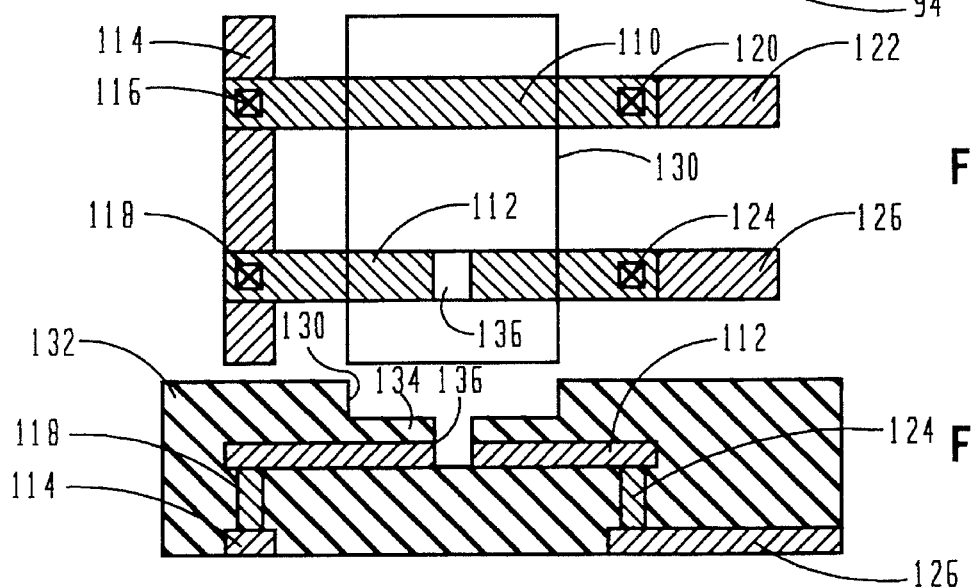
FIG. 5a
FIG. 5b
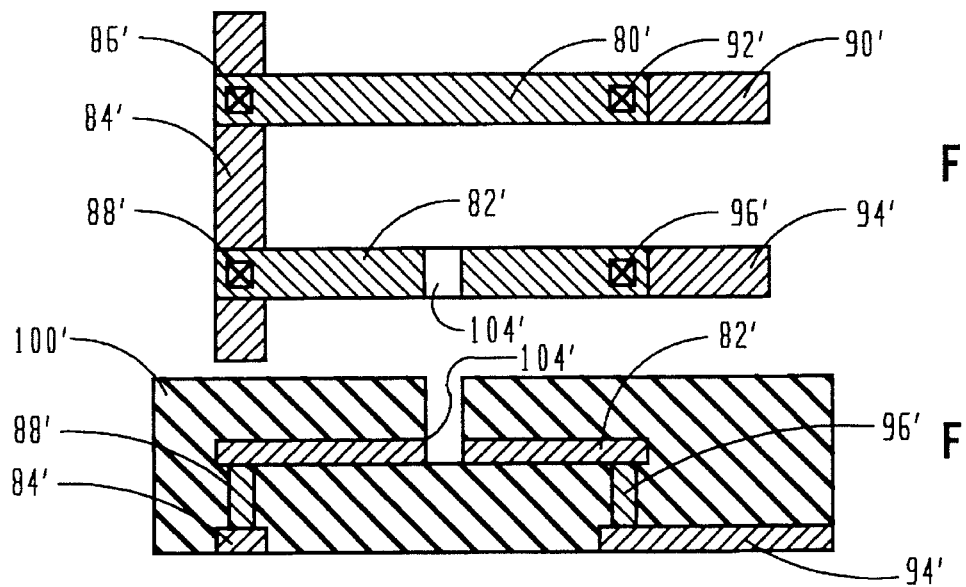
FIG. 6a
FIG. 6b

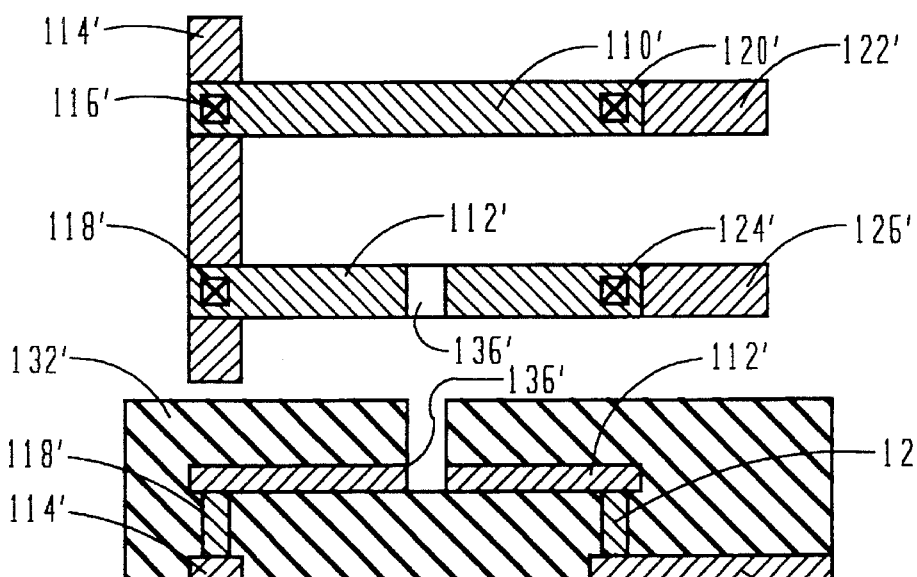
FIG. 7a
FIG. 7b
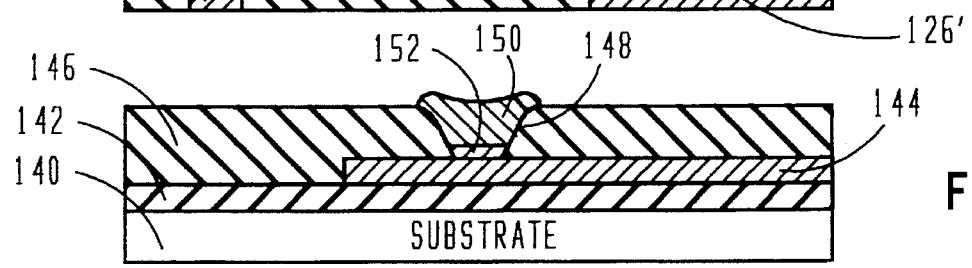
FIG. 8a
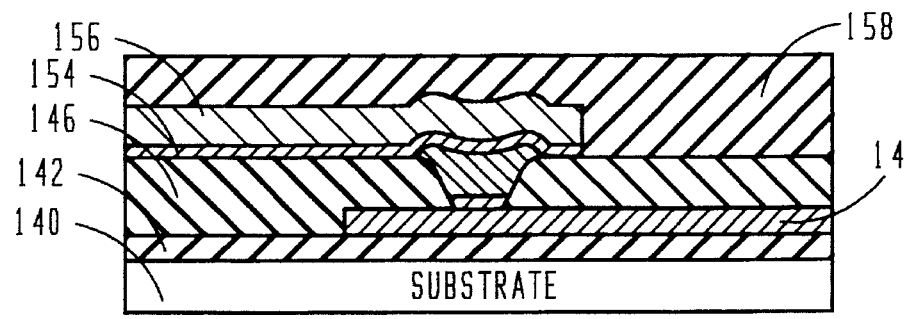
FIG. 8b
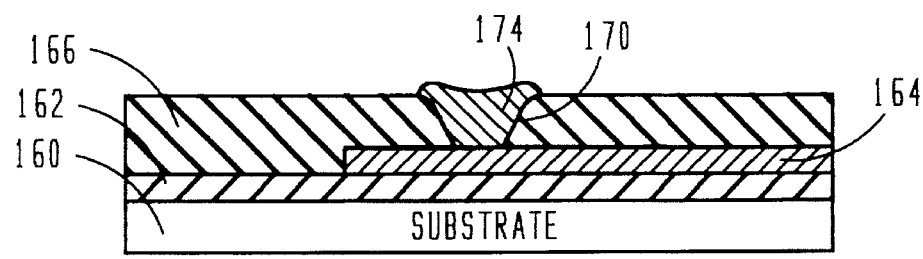
FIG. 9a
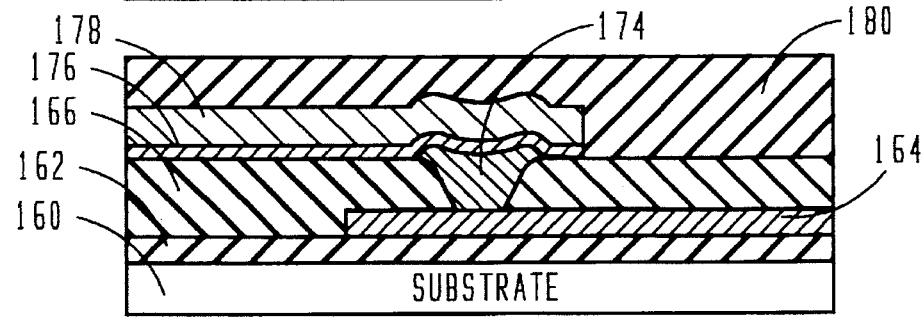
FIG. 9b 5,618,750

METHOD OF MAKING FUSE WITH NON-CORROSIVE TERMINATION OF CORROSIVE FUSE MATERIAL

TECHNICAL FIELD OF THE INVENTION

The present invention pertains in general to semiconductor fuses, and more particularly, to a fuse made with corrosive material.

BACKGROUND OF THE INVENTION

Fuses have been employed in semiconductor circuits to allow "programming" of the operation thereof after or toward the end of the processing operation. These fuses are used to program bits in registers, trim the values for resistive devices associated with various operations and also to allow selection/deselection of blocks of circuitry. In the latter, this is utilized most recently for redundant circuits.

In some semiconductor circuits, such as DRAMs, redundant circuitry is placed onto the chip and then the chip tested prior to packaging and even separating the die from the wafer. In this process, a determination is made as to which bits are the "faulty" bits and then these bits are replaced. This replacement is achieved by replacing a section of the memory, typically a column, with a redundant column. The programming is achieved such that the redundant column is not only replaced, but the address thereof is also associated with the decoded address of the faulty column. This is typically achieved through the use of fuses that are disposed in a "closed" or short-circuited mode during the processing step and then, after a determination is made as to a faulty column, the fuses are "blown". This process is typically facilitated with a laser that is used to "scribe" the fuse in the middle thereof, thus increasing the resistance thereof.

During the fabrication of a fuse, a length of conductive material, such as aluminum or tungsten is disposed on the substrate during processing of one of the metal layers. This is typically connected to other circuitry and other metal layers via contacts between layers. Thereafter, a layer of protective oxide is disposed over the fuse layer for protection thereof. This is typical with all layers on a semiconductor circuit during processing, this being a protective oxide to prevent damage to the underlying layers from the atmosphere due to such actions as corrosion, etc. Thereafter, the oxide layer can be decreased in thickness in the vicinity of the fuse, or the fuse can be at a high enough layer that the oxide is relatively thin. This will facilitate penetration of the oxide by the laser during programming of the fuse. However, once the fuse is programmed or "blown", both the oxide and the fuse are penetrated. This, therefore, exposes the ends of the fuse at the break to the atmosphere. If the fuse is made from a corrosive material, oxidation or various chemical reactions can occur that will travel along the fuse to other metal layers to which it is attached. This corrosion can therefore cause failures at a later time.

SUMMARY OF THE INVENTION

The present invention disclosed and claimed herein comprises an integrated circuit with a semiconductor fuse for being connected to other circuitry on the integrated circuit. The fuse includes a fuse region of a corrosive conductive material formed in a strip configuration. The corrosive conductive material exhibits substantial corrosive properties upon exposure to a select atmosphere. A barrier region of non-corrosive conductive material is disposed between the fuse region and the other circuitry on the integrated circuit, the fuse region being connected in electrical series with select circuitry of the other circuitry of the integrated circuit. The non-corrosive semiconductor material exhibits minimum corrosive properties upon exposure to the select atmosphere. A protective electrically insulating layer is then disposed over the fuse region to a thickness that will allow penetration thereof by a fuse programming device that will cause a select region of the strip to substantially reduce the conductivity thereof and expose the select region to the select atmosphere. Any corrosion that occurs at the select region will not proceed past the barrier region.

In another aspect of the present invention, the fuse region is disposed at a first layer of the integrated circuit with the other circuitry formed at a second and lower layer beneath the first layer. The lower layer, in one embodiment, includes a conductive strip of non-corrosive conductive material and a contact formed between the fuse region at the first layer and the conductive strip of non-corrosive material at the lower layer through a contact formed of the corrosive conductive material.

In a yet further aspect of the present invention, the conductive strip in the lower layer is formed of the corrosive conductive material. The contact, formed between the conductive strip in the lower layer and the fuse region of corrosive material, is formed of the non-corrosive material which forms the barrier region. In one embodiment, the non-corrosive material is polysilicon.

A technical advantage is provided in the present invention in that a fuse can be fabricated from a conductive strip of corrosive material and interconnected to other circuitry on an integrated circuit with a barrier region of non-corrosive conductive material.

A further technical advantage of the present invention is provided in that the fuse strips can be formed in one layer and connected to a strip of corrosive conductive material in a different layer with a non-corrosive conductive contact of polysilicon.

BRIEF DESCRIPTION OF THE DRAWINGS

For a more complete understanding of the present invention and the advantages thereof, reference is now made to the following description taken in conjunction with the accompanying Drawings in which:

FIG. 1a illustrates a plan view of a prior art fuse configuration;

FIG. 1b illustrates a cross-sectional view of the structure of FIG. 1a;

FIG. 2a illustrates a plan view of the prior art fuse construction;

FIG. 2b illustrates a cross-sectional view of the structure of FIG. 2a;

FIG. 3a illustrates a plan view of a prior art fuse structure;

FIG. 3b illustrates a cross-sectional view of the structure of FIG. 3a;

FIG. 4a illustrates a plan view of one embodiment of the fuse structure of the present invention;

FIG. 4b illustrates a cross-sectional view of the structure of FIG. 4a;

FIG. 5a illustrates a plan view of another embodiment of the present invention;

FIG. 5b illustrates a cross-sectional view of the fuse structure of FIG. 5a;

FIG. 6a illustrates a plan view of an alternate embodiment of the embodiment of FIG. 4a;

FIG. 6b illustrates a cross-sectional view of the structure of FIG. 6a;

FIG. 7a illustrates an alternate embodiment of the fuse structure of FIG. 5a;

FIG. 7b illustrates a cross-sectional view of the fuse structure of FIG. 7a;

FIGS. 8a and 8b illustrate the processing step for forming the fuse structure of FIGS. 4a and 4b and FIGS. 6a and 6b; and FIGS. 9a and 9b illustrate the steps for forming the fuse structure of FIGS. 5a and 5b and FIGS. 7a and 7b.

DETAILED DESCRIPTION OF THE INVENTION

Referring now to FIGS. 1a and 1b, them is illustrated a plan view of a prior art fuse structure and the cross-sectional view thereof. Two fuses are illustrated, a fuse 10, which is not blown, and a fuse 12 which is blown. Each of the fuses 10 and 12 are fabricated from a non-corrosive material such as polycrystalline silicon (poly) or a polysilicon crystalline layer with a high conductivity silicide disposed on the surface thereof (polycide). The fuses 10 and 12 are disposed under a window 14 which comprises an etched-back portion of an overlying protective oxide. The fuses 10 and 12 extend across the window to connect on one side to a corrosive metal layer patterned in the form of a strip 18 and on the other side to two corrosive strips 20 and 22, respectively, with strip 20 connected to the opposite end of the fuse 10 and strip 22 connected to the opposite end of the fuse 12. The reason for the etched-back window 14 is it allows a thinner layer of oxide to be disposed over the fuses 10 and 12 that is similar in thickness to the thickness of protective oxide over the strips 18 and 22. Fuse 10 is connected to the strip 18 with a contact 24 and to the strip 20 with a contact 26. Similarly, the fuse 12 is connected to the strip 18 with a contact 28 and on the opposite side thereof to the strip 22 with a contact 30.

With specific reference to FIG. 1b, there is illustrated a cross-sectional diagram of the fuse 12. It can be seen that fuse 12 is fabricated from a lower level of poly or polyside which can be formed in a double or triple level poly system. Overlaying the poly layers is typically a metal layer, from which the strip 18 and the strip 22 are fabricated, this typically being aluminum. Prior to forming and patterning the layer from which the strips 18 and 22 are fabricated, contacts are formed, such that the contacts 28 and 30 can be fabricated. Thereafter, a layer 32 of protective oxide is disposed on the substrate overlying the metal layer and then the window 14 etched therein. The window 14 is etched such that a layer 36 of protective oxide thinner than the original layer 32 covers the fuse 12. During programming, this layer 36 of oxide is penetrated to form an opening 38 in the fuse 12. This effectively renders the fuse path non-conductive or at an extremely high resistance. It can be seen that since the fuse 12 itself is formed of a non-corrosive material, corrosion will not begin at the ends of the fuse 12 and the opening 38 and extend backward therealong to propagate along the corrosive strips 18 and 22.

Referring now to FIGS. 2a and 2b, there are illustrated a plan view and a cross-sectional view, respectively, of another embodiment of a prior art fuse. In FIG. 2a, the plan view, two fuses, 42 and 44, are fabricated from a corrosive material such as aluminum. Each of the fuses 42 and 44 is connected on one end to a conductive strip 46 fabricated from a corrosive material through contacts 48 and 50, respectively. The opposite end of fuse 42 is connected through a contact 52 to a conductive strip 54 fabricated from a corrosive material. The opposite end of fuse 44 is connected through a contact 56 to a strip 58 of corrosive material. The contacts 48, 50, 52 and 56 are also fabricated from a corrosive material.

FIG. 2b illustrates a cross-sectional view of the fuse 44. It can be seen that the fuse 44 is disposed on a lower metal level as compared to the strip 46 and the strips 54 and 58, all of which strips 46, 54 and 58 are fabricated from a common metal layer. The fuses 42 and 44 have an etched-back window 60 formed therearound with a level of oxide 62 formed over the entire substrate with the etched-back window 60 defined therein. The etched-back window 60 defines a layer 64 of thinner oxide over the fuses 42 and 44. During the programming operation, as described above with respect to FIG. 1b, the layer of oxide 64 is penetrated and the fuse 44 opened to provide an opening 66. It is noted that now the ends of the fuse 44 on either side of opening 66 are exposed to the atmosphere and can therefore corrode. This corrosion will proceed along the fuse 44 on either side thereof, upward on either contact 50 or 56 and to the respective strips 46 or 58.

Referring now to FIGS. 3a and 3b, there are illustrated a plan view and a cross-sectional view, respectively, of an alternate embodiment of the fuse structure of the prior art. Two fuses 68 and 70 are illustrated, which are fabricated from a single level of corrosive material such as aluminum. They are connected on one end to a common strip 72 for illustrative purposes. They are then covered by a layer of oxide 74, which during programming, is penetrated with a laser to form an opening 76 in both the oxide layer 74 and the fuse 70. This is illustrated in the cross-sectional view of FIG. 3b of the fuse 70. Since this is a corrosive layer, exposure to an unfavorable atmosphere will cause corrosion to extend from the ends of the fuse 72 in the opening 76 back along the fuse to connecting strips of corrosive material such as aluminum.

Referring now to FIGS. 4a and 4b, there is illustrated one embodiment of the fuse structure of the present invention. Two fuses, 80 and 82, are illustrated which are fabricated from a corrosive material such as aluminum. The fuses 80 and 82 are connected on one side to a strip of non-corrosive material 84 through contacts 86 and 88, respectively, the contacts 86 and 88 being fabricated from corrosive material. The other end of the fuse 80 is connected via a contact 92 to a conductive strip 90 of non-corrosive material such as polysilicon, or to the active semiconductor area on the substrate. Similarly, the fuse 82 is connected, on the opposite end thereof from the contact 88, through a contact 96 to a conductive strip 94, or to the active semiconductor area on the substrate. Contacts 92 and 96 are fabricated from a corrosive material such as aluminum. The fuses 80 and 82 in the center thereof have an etched-back window 98 formed through a protective layer of oxide 100.

With specific reference to a cross-sectional view of FIG. 4b illustrating fuse 82, it can be seen that the conductive strip 94 and the conductive strip 84 are fabricated from a common conductive layer of, for example, polycrystalline silicon or polyside. The fuse 82 is fabricated from an upper layer of, for example, aluminum, which is separated therefrom by an insulating layer of oxide. Contacts are formed through the layer of oxide to form the contacts 88 and 96. The etched-back window 98 provides a thinner layer of oxide 102 over the central portion of the fuse 82. This provides a thinner layer of oxide through which the laser must penetrate in order to sever the fuse 82, as represented by an opening 104.

Since the fuse 82 is fabricated from a corrosive material, the fuse will corrode along the length thereof on either side of opening 104 back to and through the contacts 88 and 96. However, the corrosion will stop at the strip 84 and at the strip 94, these being non-corrosive materials. Therefore, the strip 84 and the strip 94 act as "stops" to the corrosion process. This prevents contamination of the remaining portion of the surface. It is noted that direct contact through corrosive contacts to the actual semiconductor substrate that forms the active area in which active devices such as transistors are formed will also operate to terminate corrosion and will be equivalent to the conductive strips 84 and 94.

Referring now to FIGS. 5a and 5b, there is illustrated an alternate embodiment of the fuse structure of the present invention, with FIG. 5a illustrating a plan view and FIG. 5b illustrating a cross-sectional view. In FIG. 5a, there are illustrated two fuses, a fuse 110 and a fuse 112. Each of the fuses 110 and 112 may be made of a corrosive material such as aluminum. Both of the fuses 110 and 112 are connected on one end to a conductive strip 114 through contacts 116 and 118, respectively. Contacts 116 and 118 are fabricated from a non-corrosive material such as polysilicon or polyside, and the conductive strip 114 is formed from a corrosive material. The other end of the fuse 110 is connected through a non-corrosive contact 120 to a conductive strip 122, fabricated from a corrosive material. Similarly, the other end of fuse 112 is connected through a contact 124 to a conductive strip 126, fabricated from a corrosive material. An etched-back window 130 is provided over the center portion of the fuses 110 and 112.

With specific reference to the cross-sectional view of FIG. 5b, a layer of oxide 132 is disposed over the substrate with the etched-back window 130 allowing a thinner layer 134 of oxide to be disposed over the center portion of the fuse 112 and also the fuse 110 (not shown). Thereafter, a laser or similar device can be utilized to penetrate the thin oxide layer 134 and a portion of the fuse 112 to form an opening 136 in the fuse 112, thereby increasing the resistance. It can be seen, that once the opening 136 is made, the ends of the fuse 112 proximate to the opening are exposed to the atmosphere and, therefore, corrosion can proceed thereon. However, once the corrosion reaches the end of the fuse 112, abutting the contacts 118 and 124, corrosion will be halted. Note that it is only necessary that some portion of the path along the corrosive material need to have inserted in series therewith a portion of a non-corrosive material to halt corrosion. Although illustrated as being a vertical contact, this portion could be placed in series with the fuse 112 in the same layer thereof. In the embodiment of FIGS. 5a and 5b, the strip 114 and strips 122 and 126 are formed from a metal layer in a common plane. Thereafter, another layer of metal is formed above and is patterned into the fuses 110 and 112 with the contacts 118 and 124 formed through the separating oxide layer.

Referring now to FIGS. 6a and 6b, there is illustrated an alternate embodiment depicting the structure of FIGS. 4a and 4b, without the etched-back window 98, the similar structure being illustrated with "primed" numbers.

Referring now to FIGS. 7a and 7b, there is illustrated an alternate embodiment of the structure of FIGS. 5a and 5b with the structure being identical with the exception that there is no etched-back window 130. The numbers are replaced with "primed" numbers, illustrating the similarities between the two embodiments. Again, the only difference is that the etched-back window 130 is not present and the thickness of the oxide layer over 132' the entire upper level fuse 112 is the same.

Referring now to FIGS. 8a and 8b, there is illustrated one embodiment of the process steps for forming the fuse from a corrosive material and the underlying connective strips from a non-corrosive connective material. With respect to FIG. 8a, there is illustrated the first step in the process wherein a substrate 140 is provided of one conductivity type, either an N-type or a P-type. The substrate 140 is utilized to form various active regions therein, this not being disclosed or shown in the present application. After active regions are formed, additional processing steps are performed, one of which is the formation of a first layer of oxide 142 being formed on the substrate 140 to provide an insulating layer. Thereafter, a layer of polysilicon is formed over the insulating layer 142 as a conformal layer. This is then patterned to form at least one conductive strip 144. This conductive strip can be doped by an appropriate doping impurity followed by an annealing step at a predetermined temperature for a predetermined time to further lower the resistance of this conductive strip 144. Additionally, the surface of the conformal layer forming the conductive strip 144 can be subjected to a siliciding process which forms a polyside, wherein the upper surface thereof has a higher conductive material disposed thereon.

After the underlying conductive layer is formed and patterned into the conductive strip 144, a layer of interlevel oxide (ILO) 146 is disposed over the substrate and the conductive strip. Then a contact opening 148 is formed therein to expose a predetermined surface area on the conductive strip 144. The thickness of the ILO 146 is approximately 2000 Angstroms, although it should be understood that many variations exist for the thickness of the ILO 146. Thereafter, a layer of titanium nitride is formed as a barrier material and is followed by the deposition of tungsten over the surface of the substrate with a chemical vapor deposition (CVD) technique. Thereafter, the tungsten layer is etched back and this results in a plug 150 being formed in the contact opening 148 with a barrier layer 152 formed between the plug 150 and the exposed surface of the strip 144.

With reference to FIG. 8b, the next step of the process is to deposit a barrier layer 154 over the upper surface of the ILO 146, followed by the deposition of the metal layer, such as aluminum. This metal layer is deposited to a thickness of approximately 5000 Angstroms, and then patterned to form a conductive strip 156. This forms an upper layer metal conductive pattern connected to a lower level poly conductive pattern. A layer of protective oxide 158 is then formed over the metal layer 156 to a predetermined thickness and then, if an etched-back window is required, a selective etching provided.

Referring now to FIGS. 9a and 9b, there is illustrated the process steps, wherein the plug of polycrystalline silicon is formed to connect two corrosive metal layers on different levels. With specific reference to FIG. 9a, a substrate 160 is provided over which a layer of oxide 162 is formed, followed by the deposition of a metal layer. Typically, this lower level layer will be a tungsten layer. This tungsten layer will be deposited and patterned to form a conductive strip 164. Thereafter, a layer of interlevel oxide (ILO) 166 is deposited on the substrate and then a via 170 formed therein. It should be noted that the conductive strip 164 can be formed at any conductor level, it being understood that present day semiconductor circuits utilize multiple metal levels and are not restricted to a single metal level. Therefore, although illustrated as a single level of oxide 162 separating the conductive strip 164 and the substrate 160, it should be understood that multiple levels of conductor could be disposed therebetween.

After the via 170 is formed, a conformal layer of polycrystalline silicon is formed over the substrate, which polycrystalline silicon layer is either phosphorous doped or not doped, to cover the upper surface of the interlevel oxide 166 and also to fill in the via 170. The conductive strip 164 is connected thereto at the bottom of the via 170. The substrate is then subjected to a planar etch which only etches a predetermined thickness downward, leaving a plug 174 of polycrystalline silicon within the via 170. This is then subjected to heavy phosphorous doping to provide a highly doped plug 174, in the event that the layer was not previously doped. An optional anneal step can be performed to lower the resistance of the plug 174.

With specific reference to FIG. 9b, the next step is similar to that described above with respect to FIG. 8b in that a barrier layer 176 and an aluminum layer 178 are deposited. This then is patterned to form a conductive strip. A layer of oxide 180 is deposited over the top surface.

In summary, there has been provided a method and apparatus for forming a fuse in a semiconductor integrated circuit. The fuse is formed from a corrosive conductive strip, such as aluminum, which has the ends thereof terminated by non-corrosive material, which non-corrosive termination provides a connection to other conductive circuitry on the integrated circuit. With such an arrangement, when the fuse is programmed and scribed, any corrosion that occurs on the exposed ends of the fuse at the break will not proceed any further than the non-corrosive termination.

Although the preferred embodiment has been described in detail, it should be understood that various changes, substitutions and alterations can be made therein without departing from the spirit and scope of the invention as defined by the appended claims.

What is claimed is:

1. A method for forming a fuse in a semiconductor integrated circuit, the method comprising the steps of:

forming a barrier region of non-corrosive conductive material interfaced on one side thereof to other circuitry on the integrated circuit;

disposing a fuse region of corrosive conductive material interfaced with the barrier region such that the fuse region is in an electrical series configuration through the barrier region to the other circuitry, the non-corrosive conductive material of the barrier region exhibiting minimum corrosive properties upon exposure to an atmosphere and the corrosive conductive material exhibiting substantial corrosive properties upon exposure to the atmosphere;

disposing an electrically insulating layer over the fuse region to a thickness that will allow penetration therethrough by a fuse programming device that will cause the fuse region to substantially reduce the conductivity thereof and will expose the fuse region to the atmosphere; and wherein any corrosion that occurs in the fuse region will not proceed past the barrier region.

2. The method of claim 1, and further comprising the step of programming the fuse region with a fuse programming device to increase the impedance in the fuse region.

3. The method of claim 1, wherein the step of disposing the fuse region comprises forming the fuse region at a first layer with the other circuitry on the integrated circuit disposed at a second and lower layer.

4. The method of claim 3, wherein:

the step of forming the barrier region comprises forming a conductive strip of non-corrosive conductive material at the lower layer; and the method comprises the further step of:

forming a contact between the fuse region and the conductive strip of non-corrosive material.

5. The method of claim 3, wherein the lower layer includes a conductive strip of corrosive material; and the step of forming the barrier region comprises:

forming a contact of non-corrosive material between the fuse region in the first layer and the conductive strip of corrosive material at the lower level, the contact formed of non-corrosive material.

\* \* \* \* \*